United States Patent [19]

Nakano

[11] Patent Number: 5,672,917
[45] Date of Patent: Sep. 30, 1997

[54] SEMICONDUCTOR POWER SWITCH SYSTEM

[75] Inventor: Toshiya Nakano, Itami, Japan

[73] Assignee: Mitsubishi Denki Kabushiki Kaisha, Tokyo, Japan

[21] Appl. No.: 526,270

[22] Filed: Sep. 13, 1995

[30] Foreign Application Priority Data

Sep. 27, 1994 [JP] Japan ................... 6-231705

[51] Int. Cl.[6] ................................ H01H 47/00
[52] U.S. Cl. ................... 307/116; 307/125; 307/140
[58] Field of Search ................... 307/112, 113, 307/116, 125, 126, 130, 131, 139, 140

[56] References Cited

U.S. PATENT DOCUMENTS

| 5,391,932 | 2/1995 | Small et al. | 307/125 |
| 5,510,950 | 4/1996 | Bills et al. | 361/93 |

FOREIGN PATENT DOCUMENTS

| 40 35 571 A1 | 5/1991 | Germany. |
| 42 15 075 A1 | 9/1993 | Germany. |
| 58-30674 | 2/1983 | Japan. |
| 58-204377 | 11/1983 | Japan. |

OTHER PUBLICATIONS

L. Lorenz; "Neue Generation von Leistungshalbleiter-–Bauelementen".

Claus Reuber; "Effizient Kombinierte Prozesse"; (Elektronik Journal, Jan. 1993, pp. 36–40).

Primary Examiner—William M. Shoop, Jr.
Assistant Examiner—Jonathan S. Kaplan
Attorney, Agent, or Firm—Leydig, Voit & Mayer, Ltd.

[57] ABSTRACT

A semiconductor power switch system having a control portion and at least one semiconductor power switch unit (PSU) having a self-diagnosis function to simplify the connection lines between the control portion and the PSU. In the PSU, a diagnosing terminal for transmitting an abnormality signal is, by a connection line in the outer portion, connected to an input terminal for receiving a control signal so that the control signal from the control portion to the PSU and the abnormality signal from the PSU to the control portion are communicated through one bidirectional signal transmission line. That is, if an abnormality has taken place, a transistor is turned on so that the level of the bidirectional signal transmission line is fixed to the level of the abnormality signal through the diagnosing terminal and the connection line.

9 Claims, 9 Drawing Sheets

|  | | NORMAL | ABNORMAL |
|---|---|---|---|
| OUTPUT PORT | L | H | H |
| INPUT PORT | L | H | L |

SEMICONDUCTOR POWER SWITCH SYSTEM

FIELD OF THE INVENTION

The present invention relates to a semiconductor power switch system that includes a semiconductor power switch unit that has a self-diagnosis function for communicating, to a control portion of the system, the occurrence of an abnormal state, such as opening or short-circuiting of a load in the system, or an excess current.

DESCRIPTION OF THE RELATED ART

FIG. 10 is a diagram showing the structure of a known semiconductor power switch system. The known semiconductor power switch system 100 comprises a control portion 1 including a microcomputer or the like, a semiconductor power switch unit (hereinafter called a PSU) 10 connected between a power source 20 and a load 30, and a signal line group 40 connecting the foregoing elements. Although one PSU 10 is illustrated in FIG. 10, a multiplicity of PSUs 10 are actually connected to one control portion 1, and the control portion 1 collectively controls the PSUs 10.

In the control portion 1, reference numeral 2 designates an output port for transmitting a control signal, and reference numeral 3 designates an input port for receiving an abnormality signal from the PSU 10.

In the PSU 10, reference numeral 11 designates an input terminal for receiving the control signal, 12 designates a diagnosing terminal for transmitting the abnormality signal, 13 designates an input buffer circuit for converting impedance, and 14 designates a semiconductor power switch comprising a power MOSFET or the like that switches electrical power from the power source 20 to the load 30. Reference numeral 15 designates a current detector for detecting excess current in the semiconductor power switch 14, and 16 designates an open/short detector for detecting opening or short-circuiting of the load 30.

Reference numeral 17 designates a control logic circuit for transmitting the control signal to the semiconductor power switch 14 for switching the semiconductor power switch 14 off and for generating an internal abnormality detection signal when an abnormality has been detected by the current detector 15 or the open/short detector 16.

Reference numeral 18 designates a transistor for generating the abnormality signal. When the transistor 18 is turned on, the abnormality signal is produced at the diagnosing terminal 12. Reference numeral 19 designates a one-shot circuit for turning on the transistor 18 for a predetermined time in response to the internal abnormality detection signal from the control logic circuit 17. Reference numeral 21 designates an output terminal to which the load 30 is connected. Reference numeral 22 designates a power source terminal, and 23 designates a ground terminal.

Reference numeral 40 designates the signal line group connected between the control portion 1 and the PSU 10. Reference numeral 41 designates a control signal line, 42 designates an abnormality signal line, 43 designates a resistor for dropping voltage, and 44 designates a pull-up resistor for fixing the level of the abnormality signal line 42 to a high level indicating a normal state, the pull-up resistor 44 being connected to, for example, a 5 V power source that is the high level in this embodiment.

The operation of the known semiconductor power switch system is now briefly described. The PSU 10 is controlled by the control portion 1 to turn on the semiconductor power switch 14 in response to the control signal from the control portion 1 so that electrical power is supplied from the power source 20 to the load 30. The PSU 10 has a self-diagnosis function that causes the transistor 18 to be turned off if the operation is normal. As a result, the abnormality signal line 42 is fixed to the high level by the power source 20 connected through the pull-up resistor 44. Thus, the input port 3 of the control portion 1 receives the high level signal that designates a normal state.

If an excess current is detected by the current detector 15 or an opening or short-circuiting of the load 30 is detected by the open/short detector 16 while electrical power is being supplied to the load 30, the control logic circuit 17 turns off the semiconductor power switch 14. Simultaneously, the internal abnormality detection signal is transmitted to the one-shot circuit 19.

As a result, the one-shot circuit 19 turns on the transistor 18 on for a predetermined time. Thus, the level of the abnormality signal line 42 is changed from the high level to the low level, and the low level abnormality signal, giving notice of an abnormality, is transmitted to the input port 3 of the control portion 1. As a result, the control portion 1 detects the abnormality in the PSU 10.

Since the known semiconductor power switch system having the self-diagnosis function is structured as described above, at least two lines, that is, the control signal line and the abnormality signal line, must be connected between each semiconductor power switch unit and the control portion. Therefore, if a multiplicity of semiconductor power switch units are connected to the control portion, the number of abnormality signal lines must be equal to the number of control signal lines. When the number of lines increases, there arises a problem because that the circuit lines are complicated if the control portion and the semiconductor power switch units are separated from one another. Similarly, another problem arises in that the number of contacts for the lines and the terminals increases in proportion to the number of the semiconductor power switch units and, thus, the reliability of the system deteriorates.

SUMMARY OF THE INVENTION

The present invention is directed to overcoming the foregoing problems. Accordingly, an object of the present invention is to provide a reliable semiconductor power switch system with a decreased number of connection lines between a control portion and a semiconductor power switch unit and a decreased number of terminals in the semiconductor power switch unit to simplify the connection lines and decrease the number of connection points.

In view of the foregoing, according to one aspect of the present invention, there is provided a semiconductor power switch system comprising a control portion, at least one semiconductor power switch unit for controlling the supply of electrical power from a power source to a load in response to a control signal supplied from the control portion. The semiconductor power switch unit has a self-diagnosis function with which an abnormality signal is transmitted to the control portion. The control portion supplies the control signal to the semiconductor power switch unit to control the semiconductor power switch unit and has an output port for transmitting the control signal and an input port for receiving the abnormality signal from the semiconductor power switch unit. The semiconductor power switch unit includes a semiconductor power switch for switching the supply of electrical power to the load, an abnormality detection portion for detecting an abnormality in the semiconductor power switch unit, a control logic portion for controlling the semiconductor power switch in response to the control signal from the control portion, switching the semiconductor power switch off and generating an internal abnormality detection signal when an abnormality has been detected by the abnormality detection portion, an abnormality signal generating portion for generating an abnormality signal in response to the internal abnormality detection signal, and an input/output portion for receiving the control signal from the control portion and transmitting the abnormality signal generated by the abnormality signal generating portion. A bidirectional signal transmission line is connected between the output port and the input port of the control portion and the input/output portion of the semiconductor power switch unit so that the control signal and the abnormality signal are respectively communicated through the bidirectional signal transmission line.

According to another aspect of the present invention, the foregoing semiconductor power switch unit includes the input/output portion having an input terminal for the control signal, a diagnosing terminal for transmitting the abnormality signal, and a connection line for connecting the diagnosing terminal to the input terminal. The abnormality signal generating portion comprises a circuit that fixes the level of the bidirectional signal transmission line to a level realized when an abnormality has taken place, through the diagnosing terminal and the connection line, when the internal abnormality detection signal has been generated, and that communicates the fixed level to the input port of the control portion.

According to another aspect of the present invention, the foregoing semiconductor power switch unit includes the input/output portion comprising an input/diagnosing terminal for receiving the control signal and transmitting the abnormality signal, and the abnormality signal generating portion comprising a circuit that fixes the level of the bidirectional signal transmission line to a level realized when abnormality has taken place, through the input/diagnosing terminal, when the internal abnormality detection signal has been generated, and that communicates the fixed level to the input port of the control portion.

According to another aspect of the present invention, the abnormality signal generating portion generates abnormality signals respectively when the semiconductor power switch unit is operating and when the semiconductor power switch unit is not operating.

In the present invention, the connection line between the control portion and at least one semiconductor power switch unit is shared so that the number of the connection lines and connection points is decreased.

In the present invention, the semiconductor power switch unit has a structure such that the diagnosing terminal for transmitting the abnormality signal is connected through the connection line to the input terminal for receiving the control signal. Thus, the control signal supplied from the control portion to the semiconductor power switch unit and the abnormality signal supplied from the semiconductor power switch unit to the control portion are communicated through a single bidirectional signal transmission line.

In the present invention, the input terminal and the diagnosing terminal in the semiconductor power switch unit are unified into a common input/diagnosing terminal, and the input/diagnosing terminal and the control portion are connected to each other by a single bidirectional signal transmission line.

In the present invention, the abnormality signal generating portion comprises two portions that respectively generate abnormality signals to indicate the type of the abnormality, such as excess current or short-circuiting in the load while operating and opening of the load while not operating.

DESCRIPTION OF THE PREFERRED EMBODIMENTS

Preferred embodiments of the present invention are described with reference to the drawings.

FIRST EMBODIMENT

Figure 1:
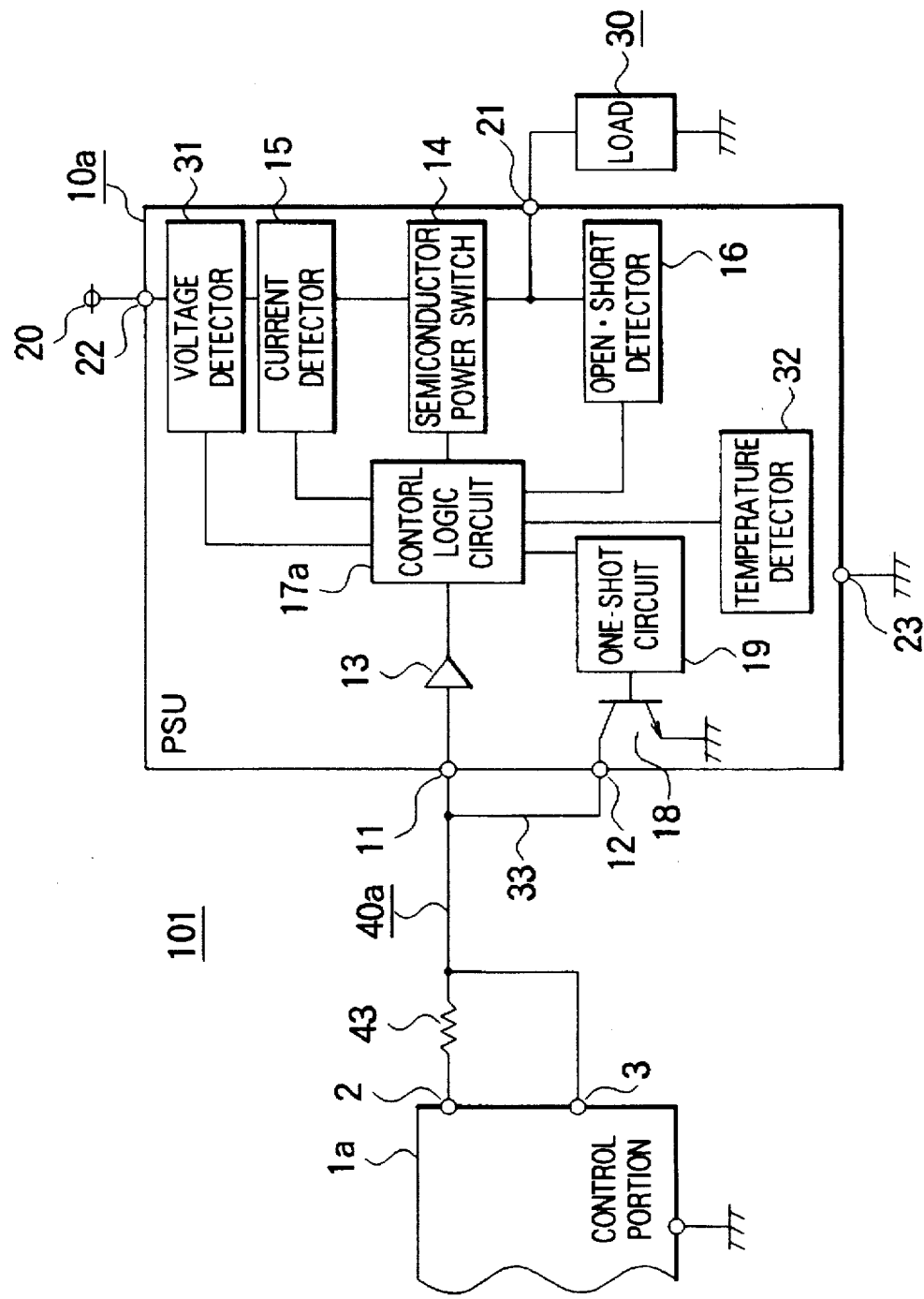
FIGS. 1 and 1A are diagrams showing the structure of a semiconductor power switch system according to a first embodiment of the present invention.
Figure 1A:
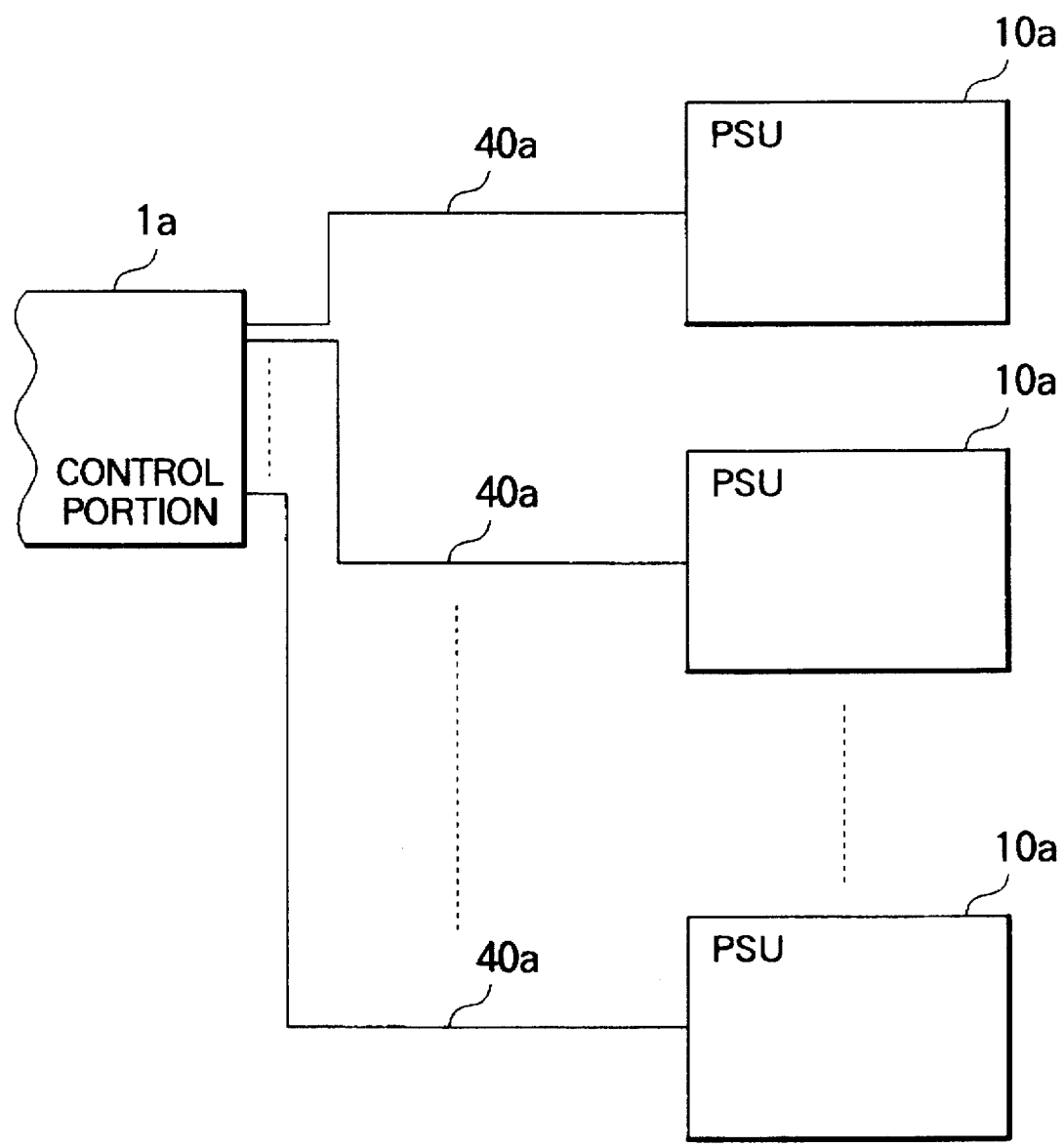

FIG. 1 is a diagram showing the structure of a semiconductor power switch system according to a first embodiment of the present invention. Referring to FIG. 1, a semiconductor power switch system 101 comprises a control portion 1a including a microcomputer or the like, a semiconductor power switch unit (hereinafter called a PSU) 10a connected between a power source 20 and a load 30, and a bidirectional signal transmission line 40a connecting the control portion and the PSU 10a. Although one PSU 10a is illustrated in FIG. 1, a multiplicity of PSUs 10a may be actually connected to one control portion 1a as in the known structure, as shown in FIG. 1A. The control portion 1a collectively controls the PSUs 10a.

In the control portion 1a, reference numeral 2 designates an output port for transmitting a control signal and 3 designates an input port for receiving an abnormality signal from the PSU 10a.

In the PSU 10a, reference numeral 11 designates an input terminal for receiving the control signal, 12 designates a diagnosing terminal for transmitting the abnormality signal, and 33 designates a connection line for connecting the diagnosing terminal 12 of the PSU 10a to the bidirectional signal transmission line 40a. Reference numeral 13 designates an input buffer circuit for converting impedance, 14 designates a semiconductor power switch comprising a power MOSFET or the like that switches electrical power from the power source 20 to the load 30. Reference numeral 15 designates a current detector for detecting excess current in the semiconductor power switch 14, and 16 designates an open/short detector for detecting opening or short-circuiting in the load 30.

Figure 10:
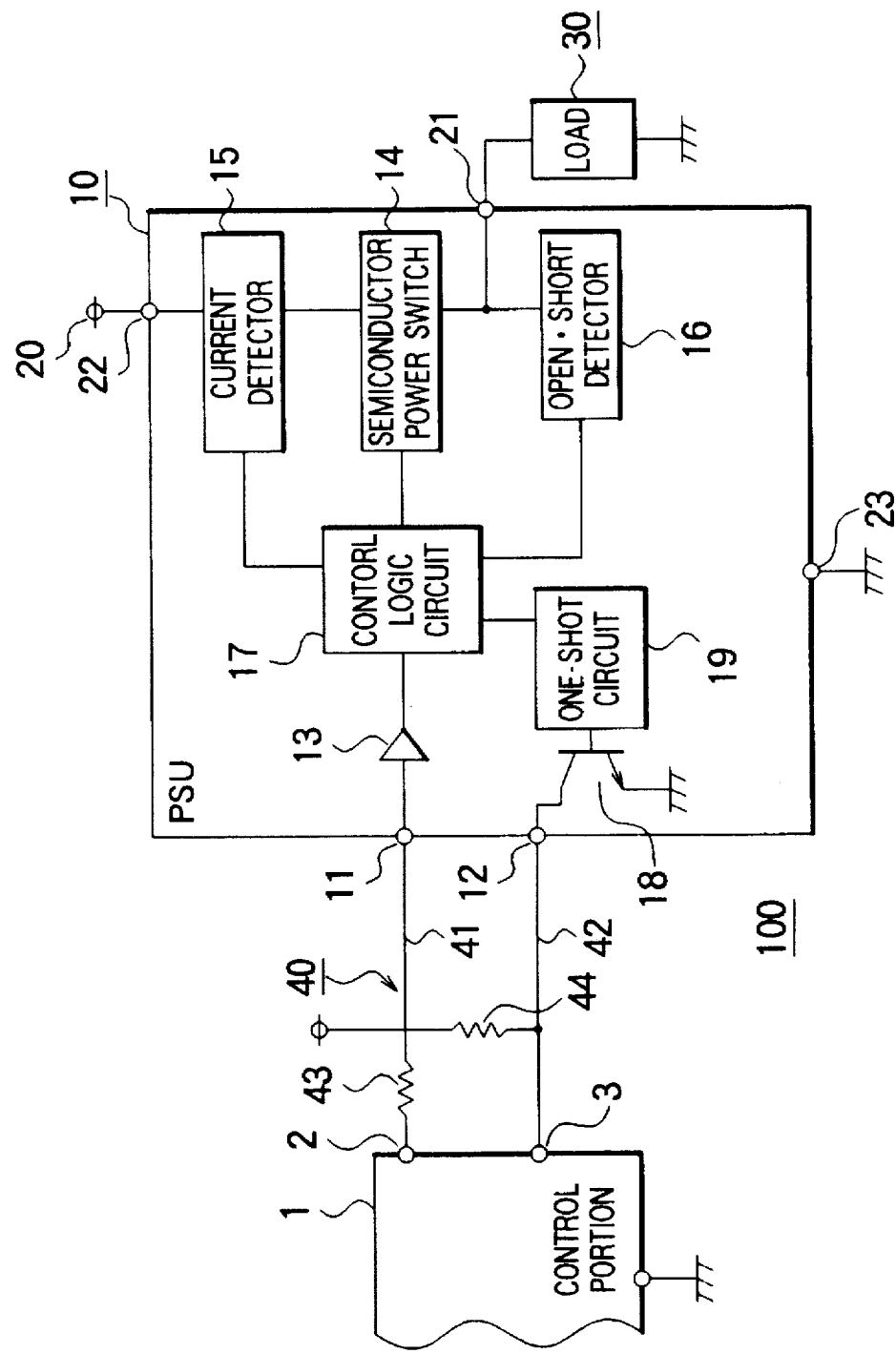
FIG. 10 is a diagram showing the structure of a privately known but unpublished semiconductor power switch system.

Reference numerals 31 and 32 respectively represent a voltage detector and a temperature detector for detecting excess voltage and overheating in the semiconductor power switch 14. Although the foregoing units have been provided in the known PSU, they are omitted from FIG. 10.

Reference numeral 17a designates a control logic circuit for transmitting the control signal to the semiconductor power switch 14 for turning off the semiconductor power switch 14 and for generating an internal abnormality detection signal when an abnormality has been detected by any of the current detector 15, the open/short detector 16, the voltage detector 31, and the temperature detector 32.

Reference numeral 18 designates a transistor for generating the abnormality signal. When the transistor 18 is turned on, the abnormality signal is produced at the diagnosing terminal 12. Reference numeral 19 designates a one-shot circuit for turning on the transistor 18 for a predetermined time in response to the internal abnormality detection signal from the control logic circuit 17a. Reference numeral 21 designates an output terminal to which the load 30 is connected. Reference numeral 22 designates a power source terminal, and 23 designates a ground terminal.

In the bidirectional signal transmission line 40a connected between the control portion 1a and the PSU 10a, reference numeral 43 designates a resistor for dropping a voltage.

The current detector 15, the open/short detector 16, the voltage detector 31, and the temperature detector 32 form an abnormality detection portion. The one-shot circuit 19 and the transistor 18 are parts of an abnormality signal generating portion. The input terminal 11, the diagnosing terminal 12, and the connection line 33 are parts of an input/output portion.

Figures 2, 3:
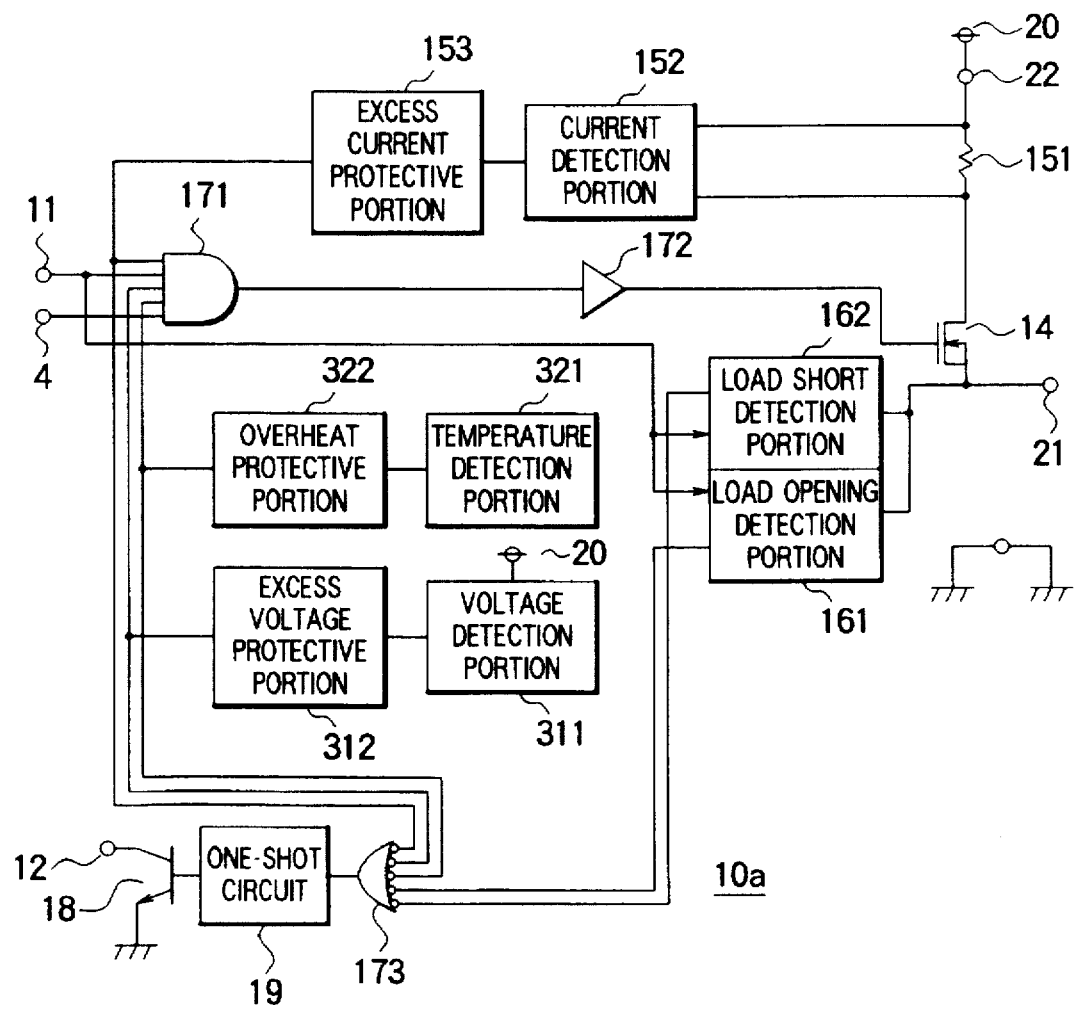
FIG. 2 shows conditions for discriminating a normal state from an abnormal state in the control portion.
FIG. 3 is a diagram showing an example of the semiconductor power switch unit shown in FIG. 1.

A PSU 10a having a high-active structure (in which the PSU 10a is brought to an active state when the level of the control signal is high) is described first. When the levels of the output port 2 and those of the input port 3 are, as shown in FIG. 2, the same, the control portion 1a determines that the PSU 10a is in a normal state. When the level of the output port 2 is high and the level of the input port 3 is low, the control portion 1a determines that the PSU 10a is in an abnormal state. The determination of normal and abnormal states is performed in accordance with a program stored in the control portion 1a.

If a high-level control signal is supplied to the input port 11 of the PSU 10a through the output port 2 of the control portion 1a, the semiconductor power switch 14 is turned on so that electrical power is supplied from the power source 20 to the load 30. Since an internal abnormality detection signal has not been transmitted from the control logic circuit 17a, the transistor 18 is controlled by the control logic circuit 17a and is turned off. As a result, the input terminal 11 is maintained at the high level so that a high-level signal is supplied to the input port 3 of the control portion 1a. Note that the impedance at the input portion of the PSU 10a is increased by the input buffer circuit 13.

If a low-level control signal is supplied to the input terminal 11 of the PSU 10a through the output port 2 of the control portion 1a, the semiconductor power switch 14 is turned off so that supply of electrical power from the power source 20 to the load 30 is stopped. At this time, the transistor 18 is turned off and, therefore, the level of the input port 3 of the control portion 1a is low.

If any of the current detector 15, the open/short detector 16, the voltage detector 31, or the temperature detector 32 has detected an abnormality when the semiconductor power switch 14 is turned on because a high-level control signal has been supplied to the input terminal 11 of the PSU 10a, the control logic circuit 17a turns off the semiconductor power switch 14 and supplies the internal abnormality detection signal to the one-shot circuit 19.

As a result, the one-shot circuit 19 is operated so that the transistor 18 is turned on for a predetermined time, thus causing the level of the bidirectional signal transmission line 40a, that is, the level of the input terminal 11, to be forcibly lowered through the connection line 33 connected to the diagnosing terminal 12 and the outer portion of the PSU 10a. Therefore, a low-level signal is supplied to the input port 3 of the control portion 1a so that the control portion 1a detects the generation of an abnormality signal in the PSU 10a. Control of the PSU 10a and communication of the abnormality signal from the PSU 10a to the control portion 1a can be performed over a single bidirectional signal transmission line 40a.

FIG. 3 shows an example of the PSU 10a shown in FIG. 1. Elements in FIG. 3 having the same reference numerals as those shown in FIG. 1 are the same or equivalent elements. The current detector 15 comprises a current detection resistor 151, a current detection portion 152, and an excess-current protective portion 153 for switching a high-level signal to a low-level signal if an excess current, larger than a predetermined value, has been detected. The voltage detector 31 comprises a voltage detection portion 311 and an excess-voltage protective portion 312 for switching the high-level signal from the excess-voltage protective portion 312 to a low-level signal if the voltage detector 31 has detected a voltage higher than a predetermined level.

The temperature detector 32 comprises a temperature detection portion 321 and an overheat protective portion 322 for switching a high-level signal from the overheat protective portion 322 to a low-level signal if the temperature of the semiconductor power switch 14 has been raised to a level higher than a predetermined level. The open/short detector 16 comprises a load-opening detection portion 161 and a load-short detection portion 162 for monitoring the output terminal 21 to which the load 30 is connected. If the open/short detector 16 has detected an open circuit or a short circuit in the load 30, the open/short detector 16 switches the high-level output signal to a low level signal.

The control signal supplied to the input terminal 11 is supplied to each of the load-opening detection portion 161 and the load-short detection portion 162. Whether the level of the control signal, that is, the level of the input terminal 11, is high or low must be recognized at the time of the detection. For example, in the detection of a short circuit in the load 30, in FIG. 3, the load-short detection portion 162 determines that a short circuit in the load 30 has taken place if the voltage of the output terminal 21 is lower than a predetermined level (for example, ½ Vcc). Since the output terminal 21 is, of course, 0 V when the level of the input terminal 11 is low and the semiconductor power switch 14 is turned off, the level of the input terminal must be considered to prevent an erroneous determination, for example, that a normal state is determined to be a short circuit.

The control logic circuit 17a comprises an AND circuit 171, a predriver 172 that is an interface between the AND circuit 171 and the power switch 14, and an OR circuit 173 for transmitting the internal abnormality detection signal to the one-shot circuit 19, the OR circuit 173 having inverting inputs.

Reference numeral 4 designates an enable-signal input terminal (not shown in FIG. 1) that is separate from the control signal terminal and is required for the control portion 1a to control a plurality of PSUs 10a by instructing the respective PSU 10a intended to be controlled. The enable signal input terminal may be omitted from the structure.

SECOND EMBODIMENT

Figure 4:
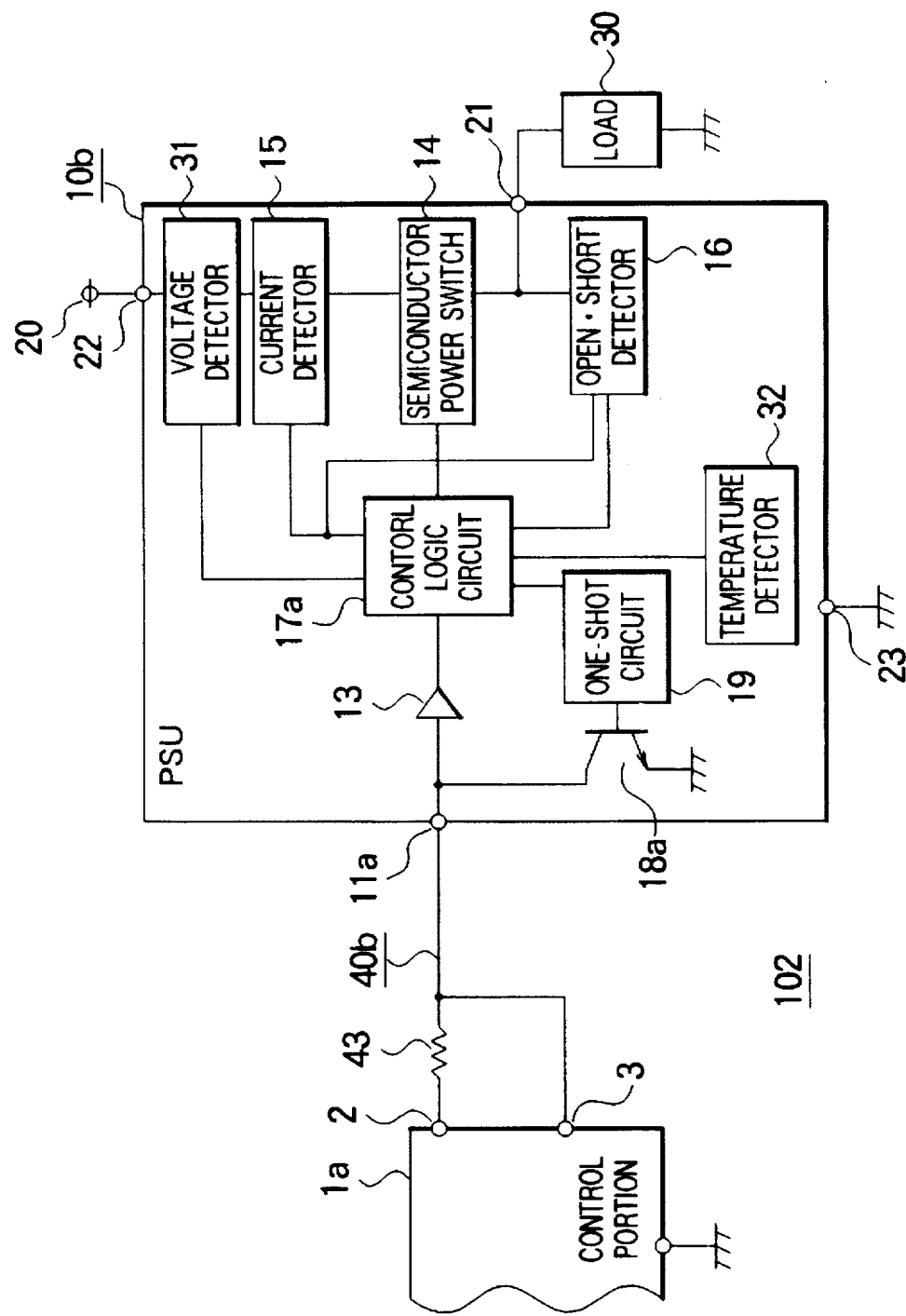
FIG. 4 is a diagram showing the structure of a semiconductor power switch system according to a second embodiment of the present invention.

FIG. 4 is a diagram showing the structure of a semiconductor power switch system according to a second embodiment of the present invention. In this embodiment, the input terminal and the diagnosing terminal of the PSU 10b are unified into a common terminal to decrease the number of the connection points in the circuit. The semiconductor power switch system 102 shown in FIG. 4 is different from that shown in FIG. 1. The PSU 10b has an input/diagnosing terminal 11a that acts as both the input terminal and the diagnosing terminal. As a result, the collector of a transistor 18a for generating the abnormality signal is, in the PSU 10b, directly connected to the input/diagnosing terminal 11a.

As a result, a bidirectional signal transmission line 40b is connected between the input/diagnosing terminal 11a of the PSU 10b and the output port 2 and the input port 3 in the control portion 1a. The output from the current detector 15 is connected to the open/short detector 16 to detect an open circuit in the load 30 in accordance with the output from the current detector 15. The other portions are basically the same as those of the first embodiment.

Figure 5:
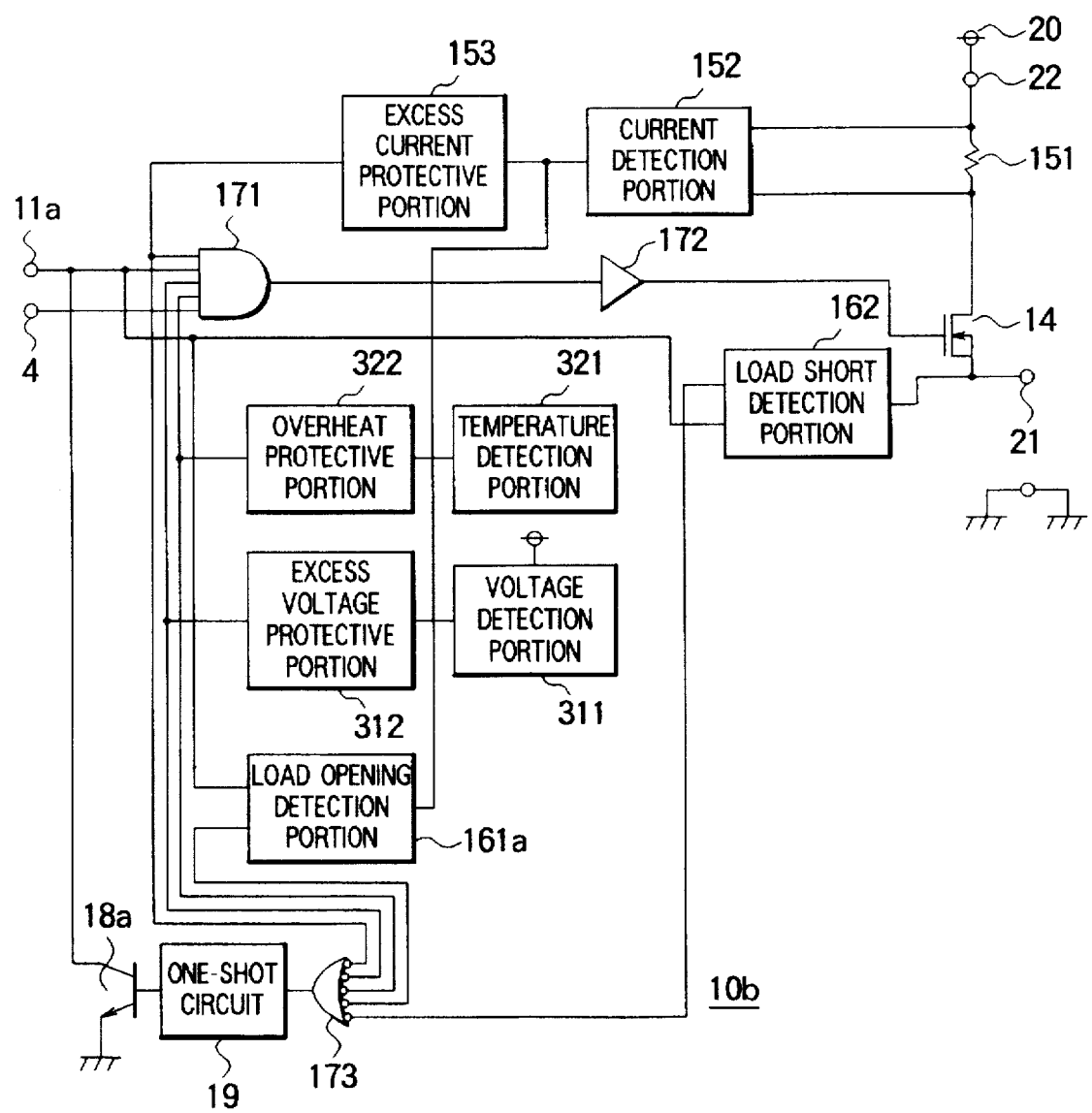
FIG. 5 is a diagram showing an example of the semiconductor power switch unit shown in FIG. 4.

FIG. 5 shows an example of a further detailed structure of the PSU 10b shown in FIG. 4. The PSU 10b is different from that shown in FIG. 3. The transistor 18a for generating the abnormality signal is, in the PSU 10b, connected to the input/diagnosing terminal 11a and a load-opening detection portion 161a detects an open circuit in the load 30 in accordance with the output from the current detector 152.

The operation is basically the same as that of the first embodiment so that the control portion 1a can detect an abnormality of the PSU 10b in accordance with the conditions shown in FIG. 2.

As described above, the semiconductor power switch system 102 according to the second embodiment comprises one terminal that serves as the input terminal of the PSU 10b as well as the diagnosing terminal of the PSU 10b. Thus, the number of the connection points in the connection line from the control portion 1a to the PSU 10b is decreased, thereby improving the reliability of the system.

Although each of the foregoing embodiments employs four factors for detecting an abnormality in the PSU, that is, excess current, excess voltage, overheating, and an open circuit/short circuit in the load, the factors are not limited to these. Some of the foregoing factors may be used or other factors may be added for detecting an abnormality.

Figure 6:
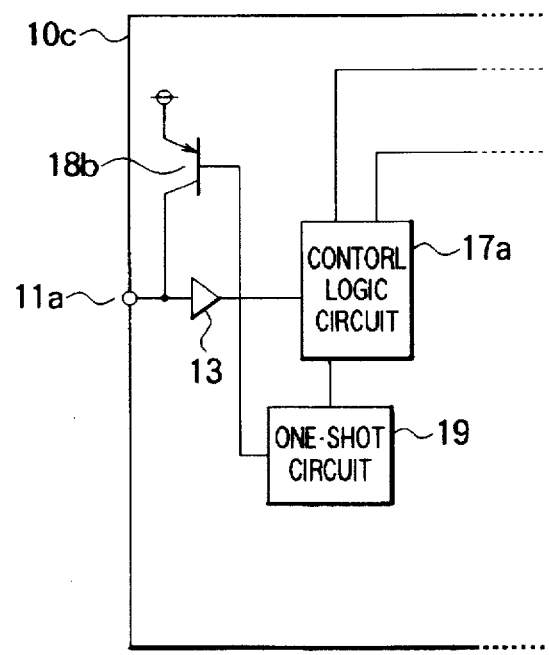
FIG. 6 is a diagram showing another example of the semiconductor power switch unit shown in FIG. 4.

Although an npn transistor that is turned on if an abnormality takes place has been employed in the foregoing embodiments, as the transistor that generates the abnormality signal, a similar effect can be obtained when the PSU has a low-active structure. For example, a PSU 10c shown in FIG. 6 includes a transistor 18b that generates an abnormality signal and that comprises a pnp transistor to fix the level of the input/diagnosing terminal 11a to a high level.

THIRD EMBODIMENT

Figure 7:
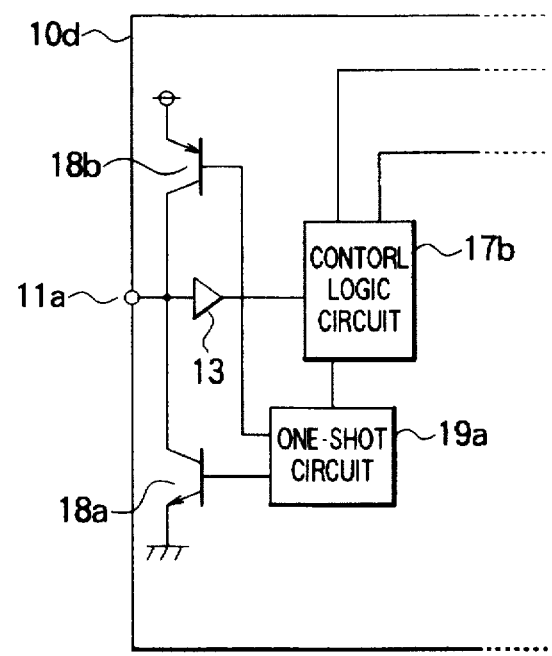
FIG. 7 is a diagram showing the structure of a portion of a semiconductor power switch unit of a semiconductor power switch system according to a third embodiment of the present invention.

FIG. 7 is a diagram showing the structure of a portion of a PSU 10d of a semiconductor power switch system according to a third embodiment of the present invention. In this embodiment, two transistors 18a and 18b for generating abnormality signals are provided for indicating the type of abnormality.

The PSU 10d has a high-active structure so that, if, for example, a short circuit in the load or an excess current is detected when the level of the control signal from the control portion is high, that is, in an operating state, the npn transistor 18a is turned on to fix the level of the input/diagnosing terminal 11a to a low level. If an open circuit in the load is detected when the level of the control signal is low, that is, in a non-operating state, the npn transistor 18a is turned on to fix the level of the input/diagnosing terminal 11a to a high level.

Figure 8:
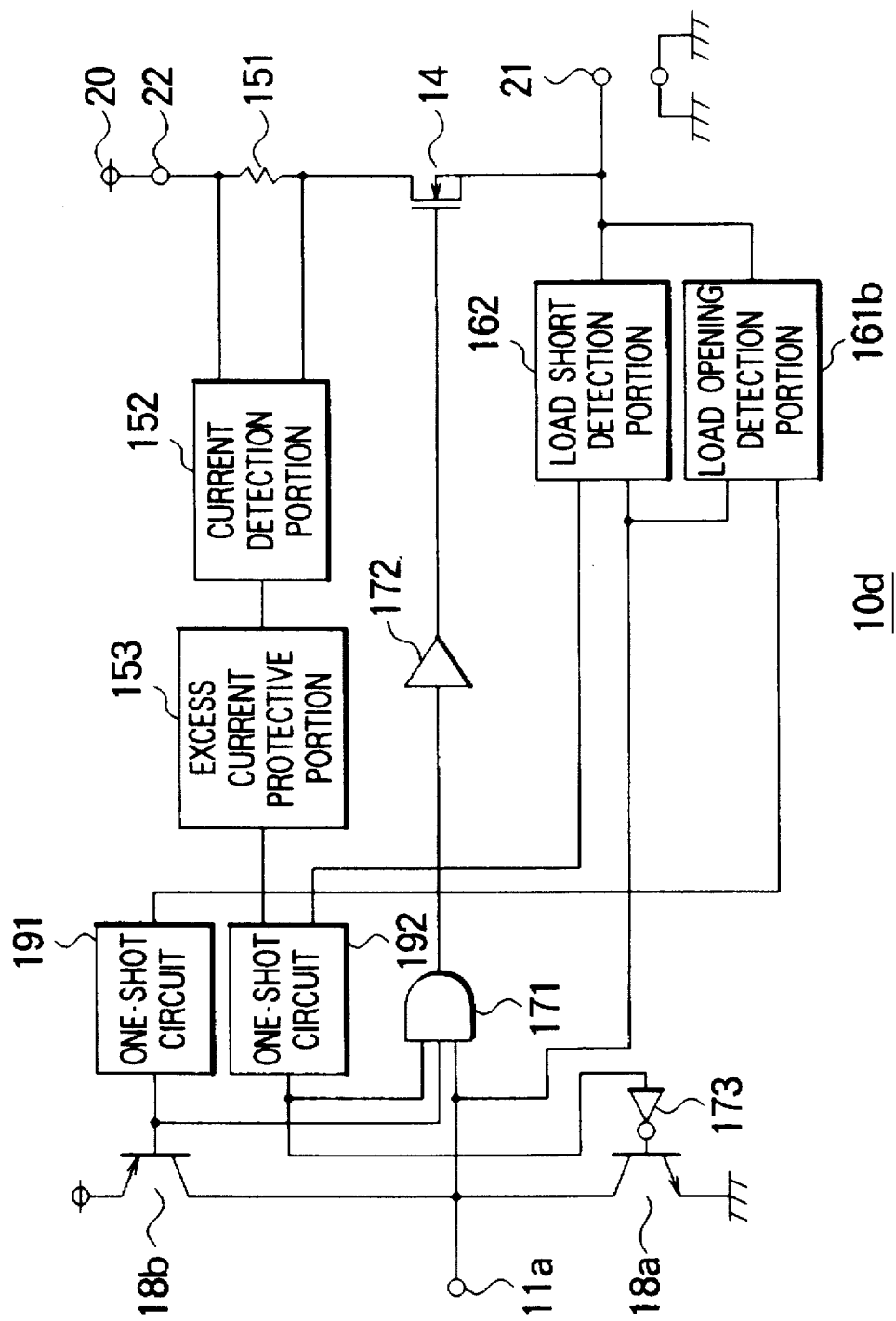
FIG. 8 is a diagram showing a detailed structure of the semiconductor power switch unit shown in FIG. 7.

FIG. 8 shows a further detailed structure of the PSU 10d shown in FIG. 7. In this case, the one-shot circuit 19a comprises two one-shot circuits 191 and 192. The output from the load-open detection portion 161b is connected to the one-shot circuit 191 that turns on the pnp transistor 18b. The outputs from the excess-current protective portion 153 and the load-short detection portion 162 are connected to the one-shot circuit 192 that turns on the npn transistor 18a. Reference numeral 173 designates an inverter circuit. The excess-voltage detection portion and the overheat detection portion are omitted in order to describe the structure simply.

When the PSU 10d is operating, detection of an excess current and a short circuit in the load can be communicated to the control portion. When the PSU 10d is in the non-operating state, an open circuit in the load can be communicated to the control portion.

Figure 9:
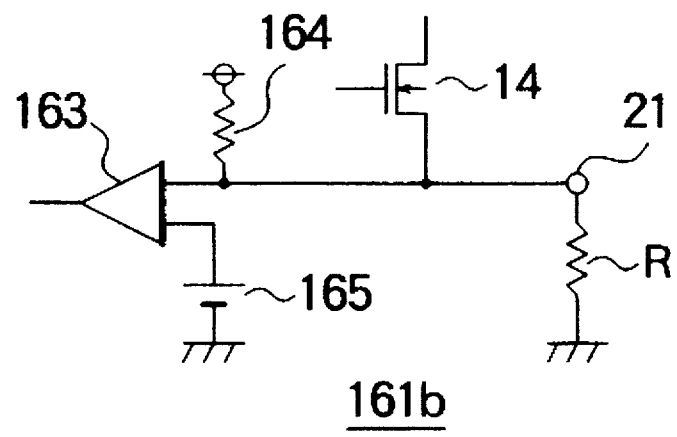
FIG. 9 is a diagram showing the structure of a portion for detecting opening of a load.

FIG. 9 shows an example of the load-open detection portion 161b shown in FIG. 8. Reference numeral 163 designates a comparator, 164 designates a pull-up resistor connected between the output terminal 21 and Vcc and having a resistance of several kilohms or larger, and 165 designates a ½ Vcc reference voltage source. Symbol R designates the resistance of the load. The resistance of the load is, for example, several ohms.

When the level of input/diagnosing terminal 11a is low, the resistance R of the load is several ohms and that of the pull-up resistor 164 is several kilohms. Therefore, if the semiconductor power switch 14 is turned off, the voltage level of the output terminal 21 is 0 V. If the output terminal 21 is in an open state, the resistance is several kilohms and the voltage level of the output terminal 21 is Vcc. Thus, by causing the comparator 163 to set the reference voltage source 165 to be ½ Vcc, an open circuit can be detected.

In the open circuit state, the level of the output from the one-shot circuit 191 is at a low level, and the pnp transistor is turned on so that the level of the input/diagnosing terminal 11a is raised for a predetermined time. At this time, to prevent the semiconductor power switch 14 being switched on, the output from the one-shot circuit 191 is connected to the AND circuit 171 to switch the semiconductor power switch 14 off.

As described above, in this embodiment, two transistors 18a and 18b for generating abnormality signals are provided to detect the type of the abnormality. Thus, the abnormality, such as an excess current or a short circuit in the load while the PSU is operating and an open circuit in the load when the PSU is not operated can be communicated to the control portion. Therefore, a semiconductor power switch system having a further advanced diagnosing function, in addition to the effect of the foregoing embodiments, is realized.

Although a one-shot circuit is employed in each of the foregoing embodiments, a latch circuit may be employed in place of the one-shot circuit.

As described above, according to the present invention, the connection line between the control portion and at least one semiconductor power switch unit is shared to decrease the number of the lines and the number of connection points. Thus, a semiconductor power switch system having a simple structure, a low cost, and exhibiting excellent reliability can be provided.

In particular, the semiconductor power switch unit has the diagnosing terminal for transmitting the abnormality signal connected to the input terminal that receives the control signal so that the control signal and the abnormality signal are transmitted through one bidirectional signal transmission line to the control portion. As a result, a semiconductor power switch system is provided with simplified connection lines between the control portion and the semiconductor power switch unit.

Furthermore, the input terminal and the diagnosing terminal of the semiconductor power switch unit are unified into one common input/diagnosing terminal and the input/diagnosing terminal and the control portion are connected to each other by one bidirectional signal transmission line. As a result, a reliable semiconductor power switch system, simplifying the connection lines between the control portion and the semiconductor power switch unit and decreasing the number of the connection points in the circuit, is provided.

In addition, the abnormality signal generating portion comprises two portions that generate abnormality signals so that the type of the abnormality can be detected. Thus, abnormalities, such as excess current or a short circuit in the load when the semiconductor power switch unit is operated and an open circuit in the load when the semiconductor power switch unit is not operated can be indicated to the control portion. Therefore, a semiconductor power switch unit can be provided that has, in addition to the effects of the foregoing aspects, a further diagnostic function.

What is claimed is:

1. A semiconductor power switch system comprising:

a control portion having an output port and an input port;

at least one semiconductor power switch unit connected to said control portion for controlling supply of electrical power from a power source to a load, in response to a control signal supplied from said output port of said control portion, said semiconductor power switch unit having a self-diagnosis function for detecting an abnormality and, in response, supplying an abnormality signal to the input port of said control portion, said semiconductor power switch unit including a semiconductor power switch for switching electrical power to said load, an abnormality detection portion for detecting an abnormality in said semiconductor power switch unit, a control logic portion connected to said semiconductor power switch and to said abnormality detection portion for controlling said semiconductor power switch in response to the control signal supplied by said control portion and for turning off said semiconductor power switch and generating an internal abnormality detection signal upon detection of an abnormality by said abnormality detection portion, an abnormality signal generating portion connected to said control logic portion for generating an abnormality signal in response to the internal abnormality detection signal, and an input/output portion for receiving the control signal supplied by said control portion and for supplying the abnormality signal; and a bidirectional signal transmission line connected to said output port and said input port of said control portion and to said input/output portion of said semiconductor power switch unit for communicating the control signal and the abnormality signal between said control portion and said semiconductor power switch unit, said input/output portion including an input terminal for receiving the control signal, a diagnosing terminal for supplying the abnormality signal, and a connection line connecting said diagnosing terminal to said input terminal and wherein said abnormality signal generating portion includes a circuit for fixing said bidirectional signal transmission line, through said diagnosing terminal, at a first level in response to generation of the internal abnormality detection signal for communicating the first level to said input port of said control portion.

2. The semiconductor power switch system according to claim 1, wherein said abnormality signal generating portion includes a transistor for connecting said diagnosing terminal to ground when the internal abnormality detection signal has been generated.

3. The semiconductor power switch system according to claim 1, including a second abnormality detection portion connected to the load and to said control logic portion for detecting a short circuit and an open circuit in the load, said control logic circuit turning off said semiconductor power switch and generating the internal abnormality signal upon detection of a short circuit or an open circuit in the load by said second abnormality detection portion.

4. A semiconductor power switch system comprising:

a control portion having an output port and an input port;

at least one semiconductor power switch unit connected to said control portion for controlling supply of electrical power from a power source to a load, in response to a control signal supplied from said output port of said control portion, said semiconductor power switch unit having a self-diagnosis function for detecting an abnormality and, in response, supplying an abnormality signal to the input port of said control portion, said semiconductor power switch unit including a semiconductor power switch for switching electrical power to said load, an abnormality detection portion for detecting an abnormality in said semiconductor power switch unit, a control logic portion connected to said semiconductor power switch and to said abnormality detection portion for controlling said semiconductor power switch in response to the control signal supplied by said control portion and for turning off said semiconductor power switch and generating an internal abnormality detection signal upon detection of an abnormality by said abnormality detection portion, an abnormality signal generating portion connected to said control logic portion for generating an abnormality signal in response to the internal abnormality detection signal, and an input/output portion for receiving the control signal supplied by said control portion and for supplying the abnormality signal; and a bidirectional signal transmission line connected to said output port and said input port of said control portion and to said input/output portion of said semiconductor power switch unit for communicating the control signal and the abnormality signal between said control portion and said semiconductor power switch unit, said input/output portion including an input terminal for receiving the control signal, a diagnosing terminal for supplying the abnormality signal, and a connection line connecting said diagnosing terminal to said input terminal and wherein said abnormality signal generating portion includes a circuit for fixing said bidirectional signal transmission line, through said diagnosing terminal, at a first level in response to generation of the internal abnormality detection signal for communicating the first level to said input port of said control portion, said input/output portion comprising an input/diagnosing terminal for receiving the control signal and for supplying the abnormality signal, and wherein said abnormality signal generating portion comprises a circuit for fixing said bidirectional signal transmission line, through said input/diagnosing terminal, at a first level when the internal abnormality detection signal has been generated for communicating the first level to said input port of said control portion.

5. The semiconductor power switch system according to claim 4, wherein said abnormality signal generating portion includes a transistor for connecting said input/diagnosing terminal to ground when the internal abnormality detection signal has been generated.

6. The semiconductor power switch system according to claim 4, including a second abnormality detection portion connected to the load and to said control logic portion for detecting a short circuit and an open circuit in the load, said control logic circuit turning off said semiconductor power switch and generating the internal abnormality signal upon detection of a short circuit or an open circuit in the load by said second abnormality detection portion.

7. A semiconductor power switch wherein comprising:

a control portion having an output port and an input port;

at least one semiconductor power switch unit connected to said control portion for controlling supply of electrical power from a power source to a load in response to a control signal supplied from said output port of said control portion, said semiconductor power switch unit having a self-diagnosis function for detecting an abnormality and, in response, supplying an abnormality signal to the input port of said control portion, said semiconductor power switch unit including a semiconductor power switch for switching electrical power to said load, an abnormality detection portion for detecting an abnormality in said semiconductor power switch unit, a control logic portion connected to said semiconductor power switch and to said abnormality detection portion for controlling said semiconductor power switch in response to the control signal supplied by said control portion and for turning off said semiconductor power switch and generating an internal abnormality detection signal upon detection of an abnormality by said abnormality detection portion, an abnormality signal generating portion connected to said control logic portion for generating an abnormality signal in response to the internal abnormality detection signal, and an input/output portion for receiving the control signal supplied by said control portion and for supplying the abnormality signal; and a bidirectional signal transmission line connected to said output port and said input port of said control portion and to said input/output portion of said semiconductor power switch unit for communicating the control signal and the abnormality signal between said control portion and said semiconductor power switch unit, said input/output portion including an input terminal for receiving the control signal, a diagnosing terminal for supplying the abnormality signal, and a connection line connecting said diagnosing terminal to said input terminal and wherein said abnormality signal generating portion includes a circuit for fixing said bidirectional signal transmission line, through said diagnosing terminal, at a first level in response to generation of the internal abnormality detection signal for communicating the first level to said input port of said control portion, said abnormality signal generating portion generating abnormality signals respectively while said semiconductor power switch unit is operating and while said semiconductor power switch unit is not operating.

8. The semiconductor power switch system according to claim 7, wherein said abnormality signal generating portion includes a first transistor for connecting said input/output portion to ground when the internal abnormality detection signal has been generated while said semiconductor power switch unit is being operated, and a second transistor for connecting said input/output portion to said power source when the internal abnormality detection signal has been generated while said semiconductor power switch unit is not being operated.

9. The semiconductor power switch system according to claim 6, including a second abnormality detection portion connected to the load and to said control logic portion for detecting a short circuit and an open circuit in the load, said control logic circuit turning off said semiconductor power switch and generating the internal abnormality signal upon detection of a short circuit or an open circuit in the load by said second abnormality detection portion.

* * * * *

UNITED STATES PATENT AND TRADEMARK OFFICE
CERTIFICATE OF CORRECTION

PATENT NO. :      5,672,917
DATED      :      September 30, 1997
INVENTOR(S) :     Nakano It is certified that error appears in the above-indentified patent and that said Letters Patent is hereby corrected as shown below:

Column 11, Line 32, after "switch" delete --wherein--.

Signed and Sealed this

Twenty-fourth Day of March, 1998

Attest:

BRUCE LEHMAN

*Attesting Officer*              *Commissioner of Patents and Trademarks*